United States Patent
Desclos

(10) Patent No.: US 10,651,824 B2
(45) Date of Patent: May 12, 2020

(54) TUNABLE FILTER FOR RF CIRCUITS

(71) Applicant: Ethertronics, Inc., San Diego, CA (US)

(72) Inventor: Laurent Desclos, San Diego, CA (US)

(73) Assignee: Ethertronics, Inc., San Diego, CA (US)

( * ) Notice: Subject to any disclaimer, the term of this patent is extended or adjusted under 35 U.S.C. 154(b) by 3 days.

(21) Appl. No.: 16/057,301

(22) Filed: Aug. 7, 2018

(65) Prior Publication Data
US 2019/0013796 A1 Jan. 10, 2019

Related U.S. Application Data

(62) Division of application No. 14/588,311, filed on Dec. 31, 2014, now Pat. No. 10,069,479.

(60) Provisional application No. 61/922,645, filed on Dec. 31, 2013.

(51) Int. Cl.
| | |
|---|---|
| *H04B 1/04* | (2006.01) |
| *H03H 11/12* | (2006.01) |
| *H04B 1/16* | (2006.01) |
| *H03F 1/56* | (2006.01) |
| *H03F 3/24* | (2006.01) |
| *H03F 3/195* | (2006.01) |
| *H03F 3/45* | (2006.01) |
| *H04B 1/10* | (2006.01) |
| *H03F 3/19* | (2006.01) |

(Continued)

(52) U.S. Cl.
CPC ........... *H03H 11/1217* (2013.01); *H03F 1/56* (2013.01); *H03F 3/19* (2013.01); *H03F 3/195* (2013.01); *H03F 3/21* (2013.01); *H03F 3/245* (2013.01); *H03F 3/45179* (2013.01); *H03F 3/45475* (2013.01); *H03H 11/1291* (2013.01); *H03H 19/004* (2013.01); *H04B 1/04* (2013.01); *H04B 1/1036* (2013.01); *H04B 1/1638* (2013.01); *H03F 2200/213* (2013.01); *H03F 2200/294* (2013.01); *H03F 2200/451* (2013.01); *H03F 2200/546* (2013.01); *H03F 2203/45544* (2013.01); *H03F 2203/45594* (2013.01); *H03H 2210/012* (2013.01); *H03H 2210/015* (2013.01); *H03H 2210/025* (2013.01); *H03H 2210/028* (2013.01); *H04B 2001/1054* (2013.01)

(58) Field of Classification Search
CPC .................................................. H04B 1/1638
See application file for complete search history.

(56) References Cited

U.S. PATENT DOCUMENTS

| | | |
|---|---|---|
| 4,370,657 A | 1/1983 | Kaloi |
| 6,326,921 B1 | 12/2001 | Egorov et al. |
| 6,429,818 B1 | 8/2002 | Johnson et al. |

(Continued)

*Primary Examiner* — Hai L Nguyen
(74) *Attorney, Agent, or Firm* — Dority & Manning, P.A.

(57) ABSTRACT

A tunable filter is described where the frequency response as well as bandwidth and transmission loss characteristics can be dynamically altered, providing improved performance for transceiver front-end tuning applications. The rate of roll-off of the frequency response can be adjusted to improve performance when used in duplexer applications. The tunable filter topology is applicable for both transmit and receive circuits. A method is described where the filter characteristics are adjusted to account for and compensate for the frequency response of the antenna used in a communication system.

10 Claims, 18 Drawing Sheets

(51) Int. Cl.
*H03F 3/21* (2006.01)
*H03H 19/00* (2006.01)

(56) References Cited

U.S. PATENT DOCUMENTS

| | | |
|---|---|---|
| 6,614,400 B2 | 9/2003 | Egorov |
| 6,714,162 B1 | 3/2004 | Kadambi et al. |
| 6,765,536 B2 | 7/2004 | Phillips et al. |
| 6,943,619 B1 | 9/2005 | Shuler |
| 6,950,065 B2 | 9/2005 | Ying et al. |
| 7,081,854 B2 | 7/2006 | Ying et al. |
| 7,330,152 B2 | 2/2008 | Zhang et al. |
| 7,345,638 B1 | 3/2008 | Tan et al. |
| 7,834,813 B2 | 11/2010 | Caimi et al. |
| 8,564,485 B2 | 10/2013 | Milosavljevic et al. |
| 9,035,836 B2 * | 5/2015 | Desclos .......... H01Q 9/06 343/700 MS |
| 9,246,223 B2 | 1/2016 | Badaruzzaman et al. |
| 10,069,479 B1 * | 9/2018 | Desclos ........... H03H 11/1217 |
| 2013/0141293 A1 | 6/2013 | Desclos et al. |

* cited by examiner $$Fo = \frac{1}{2\pi RC}$$

Transmission loss characteristics of tunable filter only compared to SAW filter optimized for Band 8 frequencies Transmission loss characteristics of tunable filter and antenna compared to SAW filter optimized for Band 8 frequencies

TUNABLE FILTER FOR RF CIRCUITS

CROSS-REFERENCE TO RELATED APPLICATIONS

The present application is a divisional of U.S. application Ser. No. 14/588,311, filed on Dec. 31, 2014, now U.S. Pat. No. 10,069,479; which issued on Sep. 4, 2018 which claims the benefit of priority to U.S. Provisional Application Ser. No. 61/922,645, filed Dec. 31, 2013; the contents of which are hereby incorporated by reference. Applicant claims priority to and the benefit of each of such applications and incorporate all such applications herein by reference in its entirety.

FIELD OF INVENTION

The present invention relates generally to the field of wireless communication; and more particularly, to tunable filters as applied to RF front-end configurations in communication systems and dynamic adjustment of bandwidth characteristics of RF circuits.

BACKGROUND OF THE INVENTION

As the need for higher data rates increases, communication systems are being designed to cover wider frequency bandwidths as well as a larger number of frequency bands. The introduction of 4G protocols such as Long Term Evolution (LTE) are a main driver in the increase in additional frequency bands being used for cellular communication systems. The complexity of the RF front-end topology of communication systems is increasing due to the need for backward compatibility with 2G and 3G protocols as 4G LTE capability is introduced. In addition, Advanced LTE as a protocol is configured to accommodate carrier aggregation, where multiple channels can be transmitted or received on simultaneously to increase instantaneous bandwidth. This aggregation of channels can cover up to five channels spread across multiple frequency bands. Carrier aggregation that utilizes multiple frequency bands points to a need for dynamic tuning of various components of the RF front-end including the filters to provide the flexibility needed to access various frequency pairings. All of these trends point toward a growing need for more flexibility in the RF front-end of mobile communication systems to address the combining of multiple frequency bands and modes.

Dynamic tuning of components that comprise the RF front-end of communication systems is picking up adoption in the commercial communications industry, and proper implementation of dynamic tuning methods can bring improvements to communication system performance as the number of frequency bands that can be accessed grows and the instantaneous bandwidths required increases.

The requirement to design a mobile device such as a cell phone that covers multiple frequency bands and multiple modes of operation forces the system designers to develop a front-end transceiver circuit that combines several power amplifiers (PA) on the transmit side and several low noise amplifiers (LNA) on the receive chain. Typically, each PA and LNA requires a filter to reduce spurious emissions and harmonics. Without the filters in the circuit, the PA will amplify unwanted frequency components which can fall within the frequency band of receive functions. On the receive side, the absence of filtering will cause the LNAs to amplify unwanted frequency components which can result in an increase in the noise floor in the receive chain. This increase in noise floor can result in reduced Signal to Noise Ratio (SNR) which in turn can result in an increase in Bit Error Rate (BER), with the end result being a decrease in data rate for data transmission.

The filters used in current commercial communication systems have a fixed frequency response. The start and stop frequencies which establish the instantaneous bandwidth as well as the center frequency are fixed. The conventional technique for implementing filters in a communication system is to determine the frequency bandwidth required from the filter along with the slope of the skirts (the roll-off in performance as a function of frequency) for a specific function and location within the circuit topology. A filter that meets the frequency response requirements is designed, manufactured, and implemented in the circuit. Very good filtering can be achieved using SAW (Surface Acoustic Wave), BAW (Bulk Acoustic Wave), and FBAR (Film, Bulk Acoustic Resonator) filter types in a fixed filter implementation. The main drawback is the inability to dynamically alter or tune a filter response once it is implemented in a circuit. A tunable filter would provide the capability of dynamically adjusting the bandwidth of a transmit or receive circuit to track changes in bandwidth for LTE waveforms. LTE provides for a range of bandwidths for a data stream based upon the amount of data needed to transmit or receive and priority of the data stream in the cellular network. LTE bandwidths can vary from 1.5 MHz to 20 MHz. With carrier aggregation being implemented in LTE-Advanced (LTE-A), there is now a potential of up to five channels being aggregated to increase instantaneous bandwidth to 100 MHz. A tunable filter would provide the capability of matching the bandwidth of the communication system front-end to the instantaneous bandwidth of the LTE waveform.

SUMMARY OF THE INVENTION

A method of designing a tunable filter that can dynamically adjust the center frequency and bandwidth characteristics of the filter is described. Novel circuit topologies are disclosed that provide the capability to adjust the center frequency of the filter without affecting the bandwidth characteristics, adjust the bandwidth characteristics without affecting the center frequency, or adjust both the center frequency and bandwidth characteristics simultaneously.

DETAILED DESCRIPTION OF THE PREFERRED EMBODIMENTS

Figure 1A:
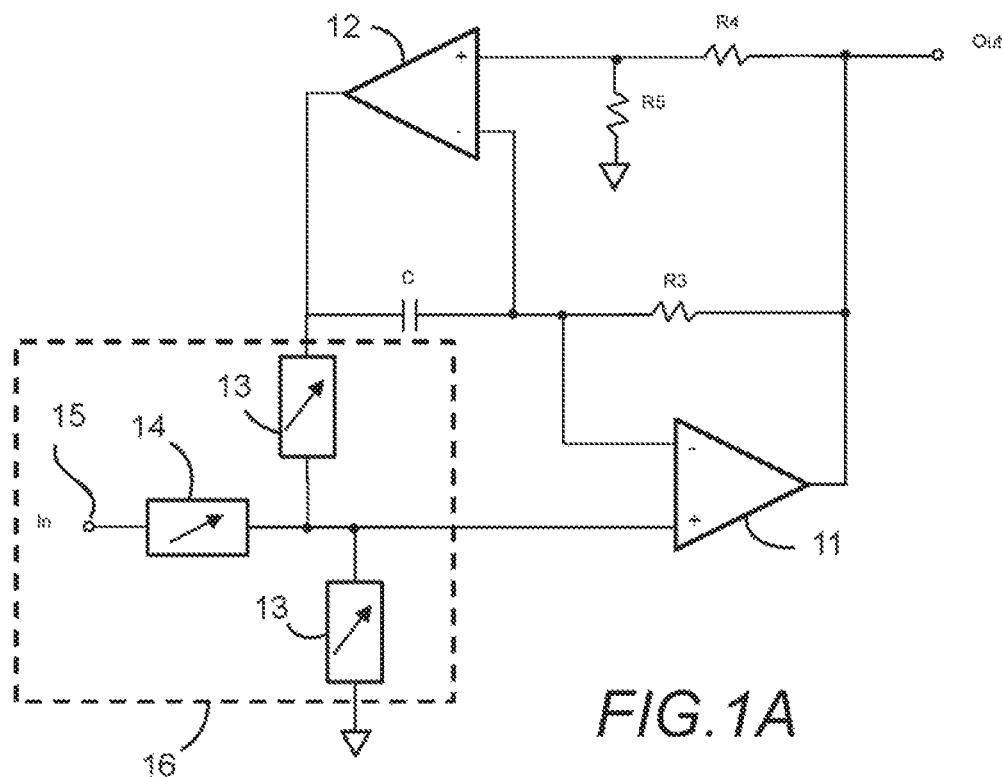
FIGS. 1(A-B) illustrate a tunable filter formed by two operational amplifiers, where variable impedances are coupled to the non-inverting input of the first operational amplifier.

One embodiment is realized in an RF circuit topology wherein two operational amplifiers are used in a configuration with a tunable capacitor connected to the non-inverting input of the first operational amplifier. The tunable capacitor is used to alter the center frequency of the band-pass filter formed by the circuit. By connecting the tunable capacitor in shunt between the non-inverting input of the first operational amplifier and ground, a change in capacitance of the tunable capacitor will translate into an inverse change in frequency of the filter response of the circuit. The tunable capacitor can be implemented using one of several different techniques or types such as a MEMS device, switched capacitor assembly fabricated in CMOS, Silicon on Insulator (SOI), Silicon on Sapphire (SOS), or Gallium Arsenide (GaAs), a Barium Stronium Titanate (BST) capacitor, or varactor diode.

In another embodiment a variable resistor circuit is connected to the output of the second operational amplifier, with this variable resistor circuit connected in turn to the non-inverting input of the first operational amplifier. A change in resistance of the variable resistor circuit will translate into an inverse change in frequency of the filter response of the circuit. One implementation of a variable resistor circuit can be a pair of multi-port switches with fixed resistors between port pairings, such that the switches can be activated in unison to allow switching from one port to the next.

In another embodiment both the tunable capacitor connected to the non-inverting input to the first operational amplifier and the variable resistor circuit connected between the output of the second operational amplifier and the non-inverting input of the first operational amplifier are tuned in conjunction to adjust the frequency response of the filter circuit. The product of the resistance and capacitance will directly translate to an inverse change in frequency of the filter response of the circuit.

In another embodiment a variable resistor circuit is connected in series configuration to the non-inverting input of the first operational amplifier prior to the junction of the capacitor that is connected in shunt configuration between the non-inverting input and ground. The variable resistor circuit can be used to change the bandwidth of the filter response of the circuit by adjusting the resistance. The bandwidth is inversely proportional to the resistance of the variable resistor circuit.

In another embodiment the variable resistor circuit used to change the bandwidth is adjusted in conjunction with the variable capacitor and variable resistor circuit used to change the center frequency of the band pass response of the filter circuit. Adjusting these three components or circuits simultaneously or sequentially provides the capability of dynamically adjusting the center frequency and bandwidth characteristics of the filter circuit. With a properly designed tunable filter the center frequency can be adjusted while the bandwidth is kept constant; the center frequency can also be adjusted while the bandwidth is varied. The variable resistor circuit can also be adjusted to maintain a near constant transmission loss of the tunable filter as a function of frequency of operation.

In yet another embodiment a tunable filter can be designed and implemented in a system to take into account the frequency response of the antenna used to transmit and receive RF signals. Optimizing the tunable filter to work with a specific antenna can result in improved out of band performance when the antenna is designed to have a sharper frequency roll-off. By implementing a tunable antenna and tunable filter combination, a look-up table can be implemented to tune both the filter and antenna per frequency channel.

FIG. 1A illustrates a tunable filter formed by two operational amplifiers, including first operational amplifier 11 and second operational amplifier 12, where variable impedances are coupled to the non-inverting input of the first operational amplifier. The variable impedances provide the ability to adjust the center frequency of the filter response. The output of the second operational amplifier 12 is coupled into the non-inverting input of the first operational amplifier 11 through one of the variable impedances 13 for frequency control. A third variable impedance 14 for bandwidth control is located at the input 15 to the dynamic frequency and bandwidth control circuit 16 and is used to dynamically adjust the bandwidth of the filter response.

Figure 1B:
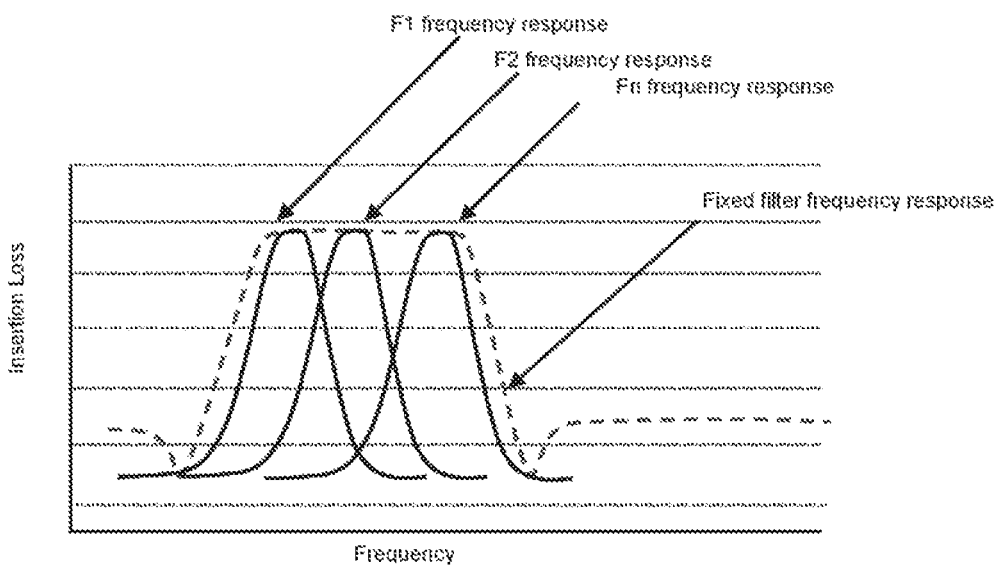

FIG. 1B shows a plot illustrating a plurality of tuned frequency responses (F1; F2; . . . ; Fn) compared to the conventional use of a fixed filter frequency response. The instant tunable filter allows for a plurality of tuned frequency responses.

Figure 2A:
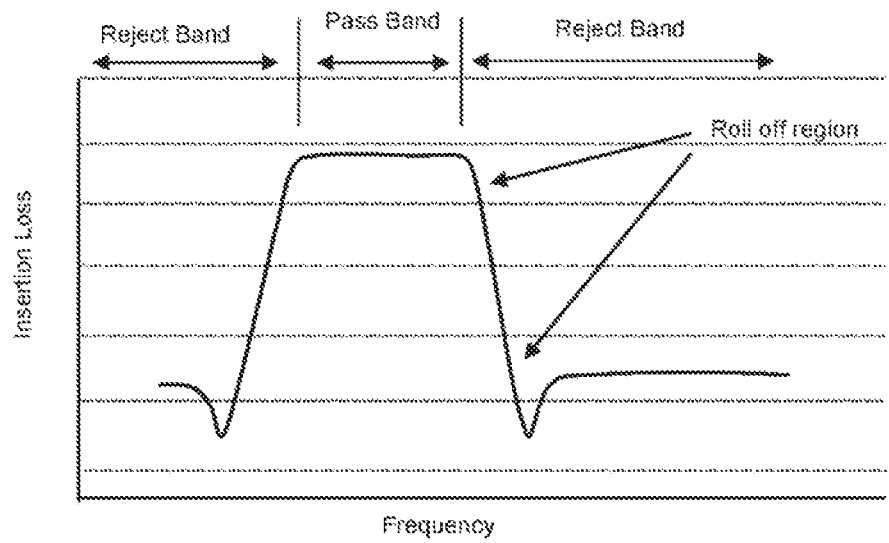
FIGS. 2(A-B) illustrate a typical frequency response for a band pass filter, with the pass band, reject band, and roll-off region defined.
Figure 2B:
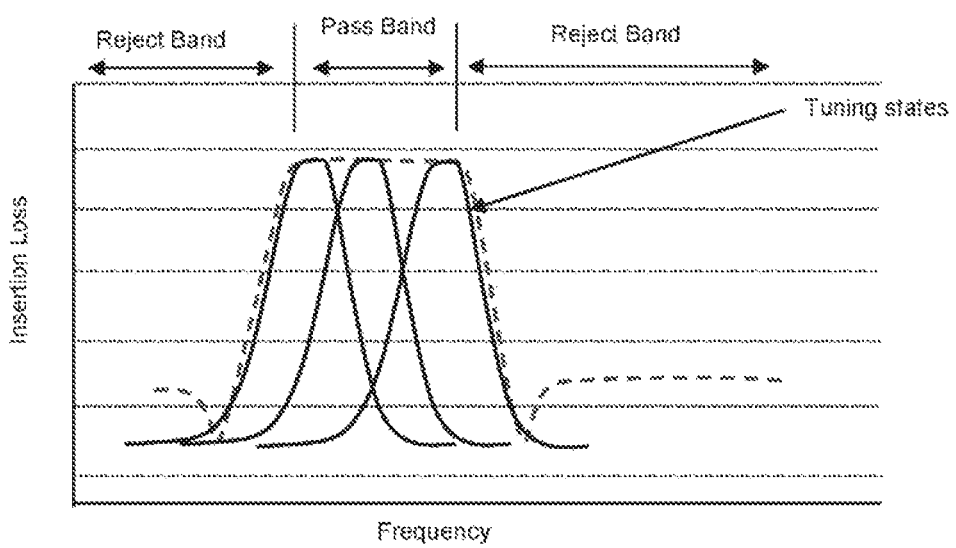

FIG. 2A illustrates a typical frequency response for a band pass filter, with the pass band, reject band, and roll-off region defined. In FIG. 2B, the filter characteristics of a tunable filter are shown, where the frequency response is adjusted or tuned to cover different frequency ranges.

Figure 3A:
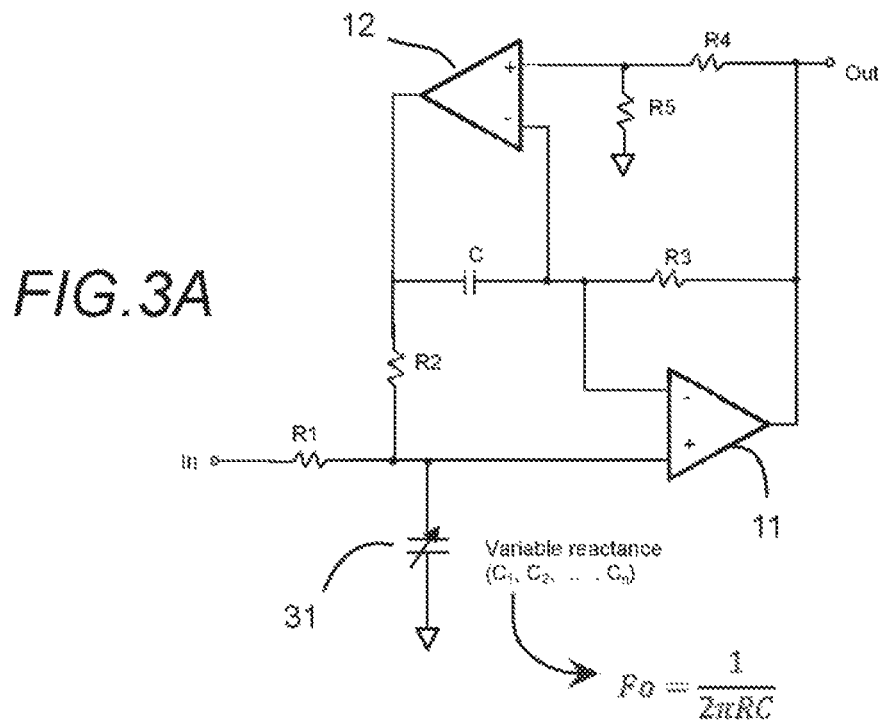
FIGS. 3(A-B) illustrate an example of a tunable filter circuit in accordance with an embodiment.
Figure 3B:
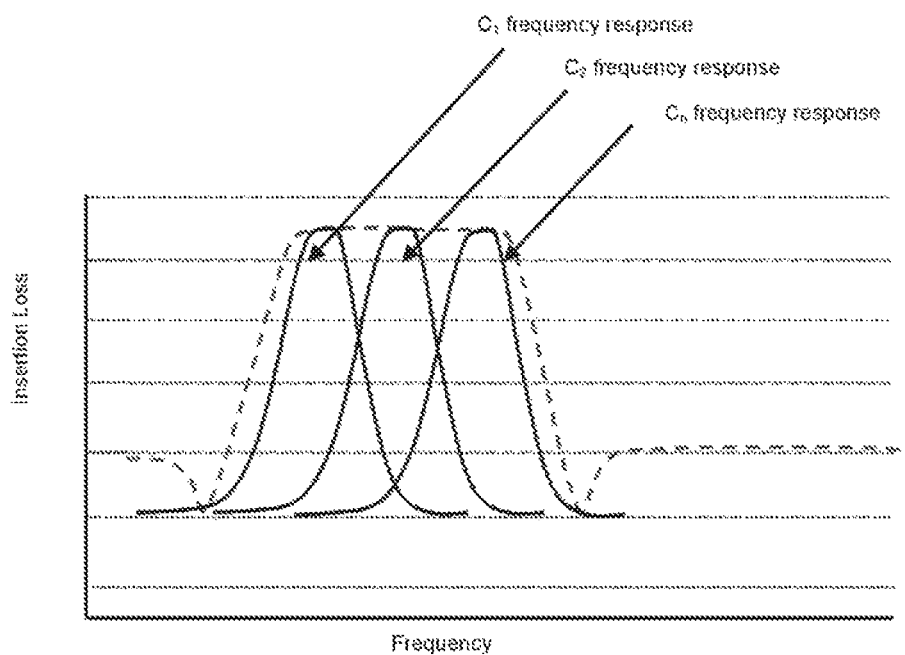

FIG. 3A illustrates an example of a tunable filter circuit where a variable capacitor 31 is coupled to the non-inverting input of first operational amplifier 11. The tunable circuit further includes a second operation amplifier 12, resistors (R1; R2; R3; R4; and R5), static capacitor (c), input port (In) and output port (Out) as shown. The tunable capacitor can be adjusted to vary the center frequency of the tunable filter. The frequency response of the tunable filter for three tuning states, $C_1$, $C_2$, and $C_n$ are shown in FIG. 3B.

Figure 4A:
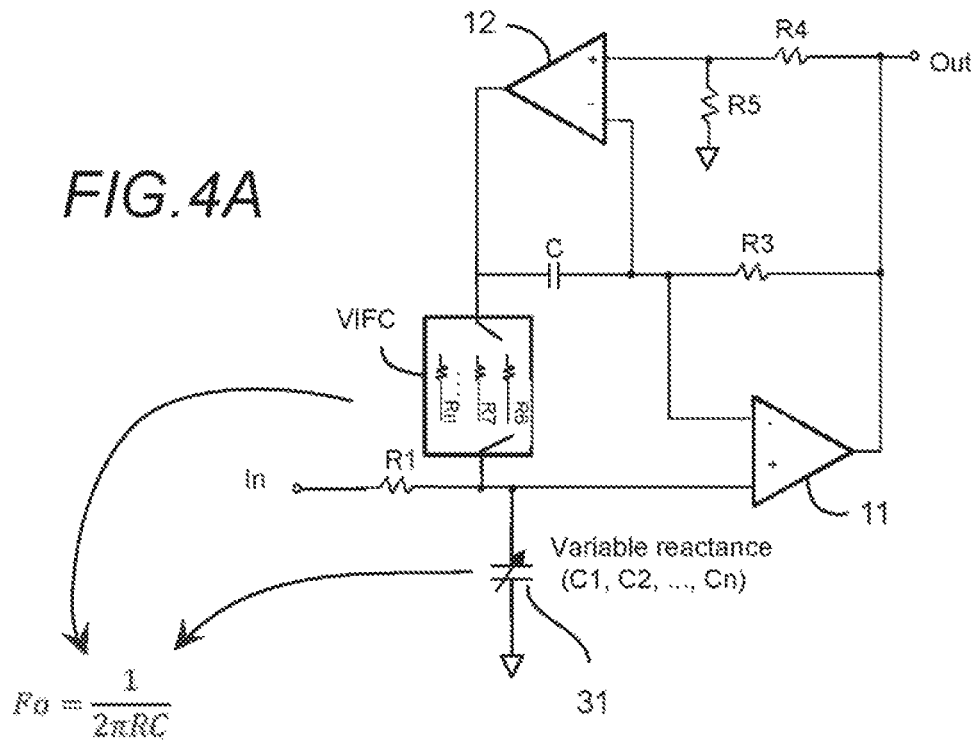
FIGS. 4(A-B) illustrate an example of a tunable filter circuit in accordance with another embodiment.
Figure 4B:
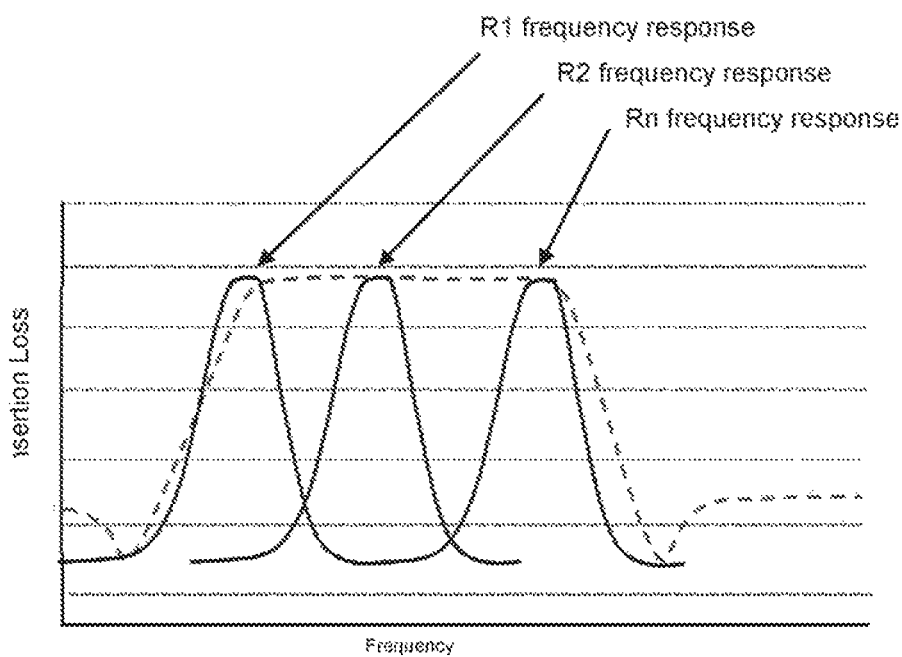

FIG. 4A illustrates an example of a tunable filter circuit where a variable capacitor 31 is coupled to the non-inverting input of first operational amplifier 11 for providing a variable reactance (C1, C2, . . . , Cn). A variable impedance frequency control (VIFC) network is also coupled to the non-inverting input of first operational amplifier 11. The resistance of the variable impedance frequency control network can be adjusted to vary the center frequency of the filter. The tunable filter circuit further includes a second operation amplifier 12, resistors (R1; R2; R3; R4; and R5), static capacitor (C), input port (In) and output port (Out) as shown. The frequency response of the tunable filter for three tuning states, $R_6$, $R_7$, and $R_n$ are shown in FIG. 4B.

Figure 5A:
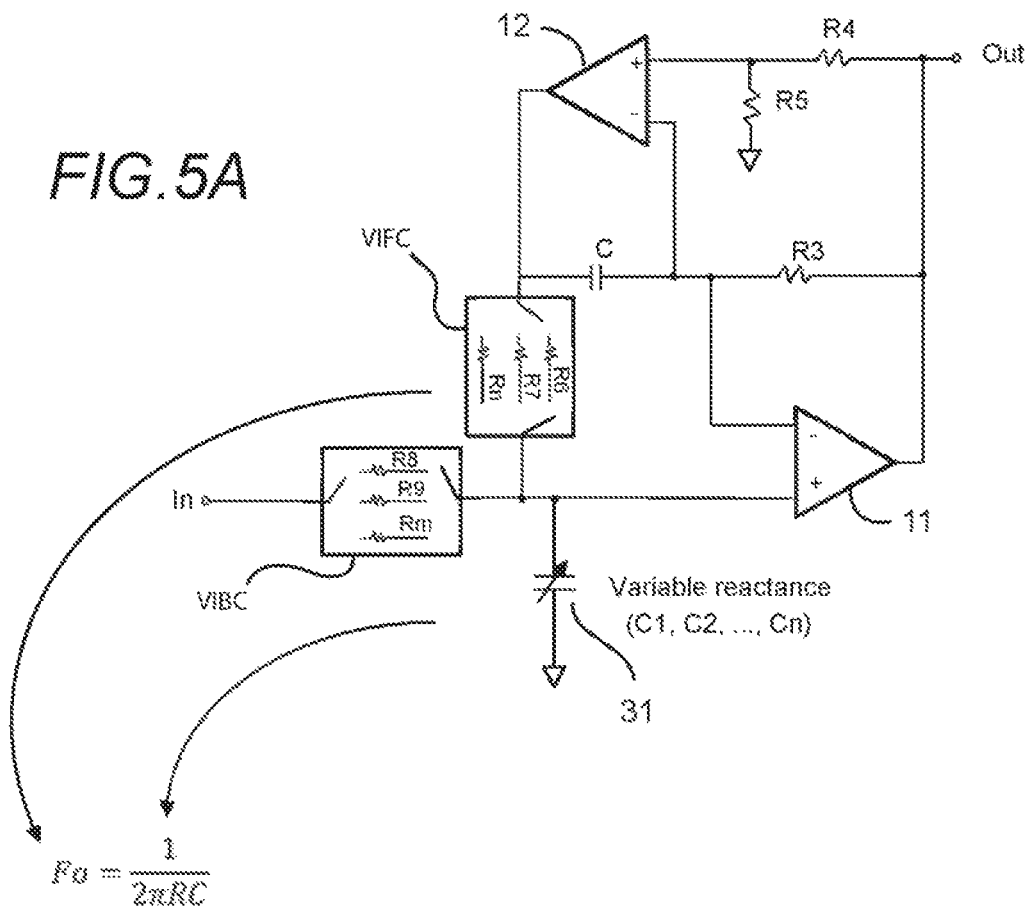
FIGS. 5(A-B) illustrate an example of a tunable filter circuit in accordance with another embodiment.
Figure 5B:
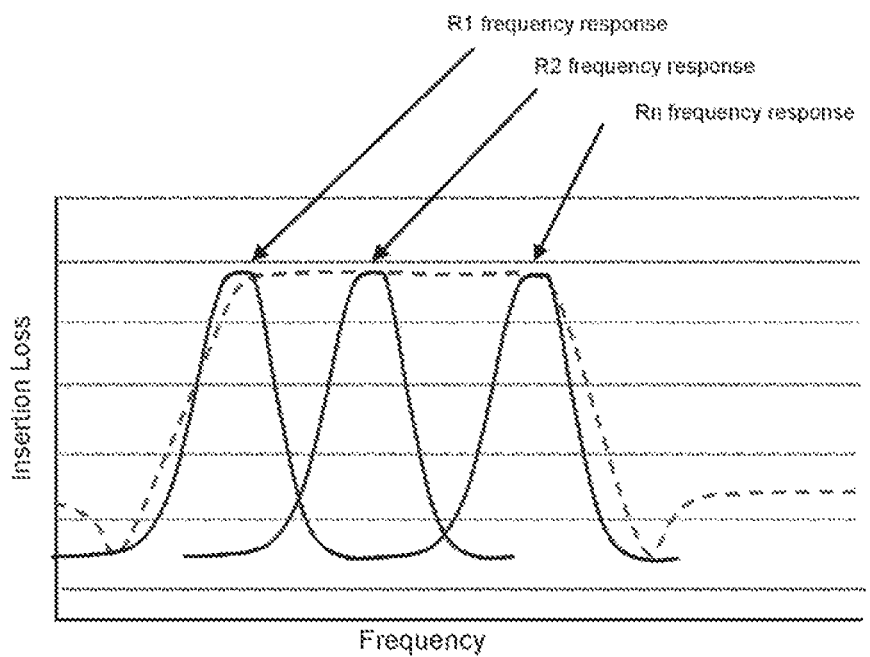

FIG. 5A illustrates an example of a tunable filter circuit where a variable capacitor 31 is coupled to the non-inverting input of first operational amplifier 11 for providing a variable reactance (C1, C2, . . . , Cn). A variable impedance frequency control (VIFC) network is also coupled to the non-inverting input of first operational amplifier 11. A second variable impedance network, variable impedance bandwidth control (VIBC) network, is coupled to the input port of the filter circuit. The resistance of the first variable impedance network can be adjusted in conjunction with the tunable capacitor to vary the center frequency of the filter. The tunable filter circuit further includes a second operation amplifier 12, resistors (R1; R2; R3; R4; and R5), static capacitor (C), input port (In) and output port (Out) as shown. The frequency response of the tunable filter for three tuning states, $R_1$, $R_2$, and $R_n$ are shown in FIG. 5B.

Figure 6A:
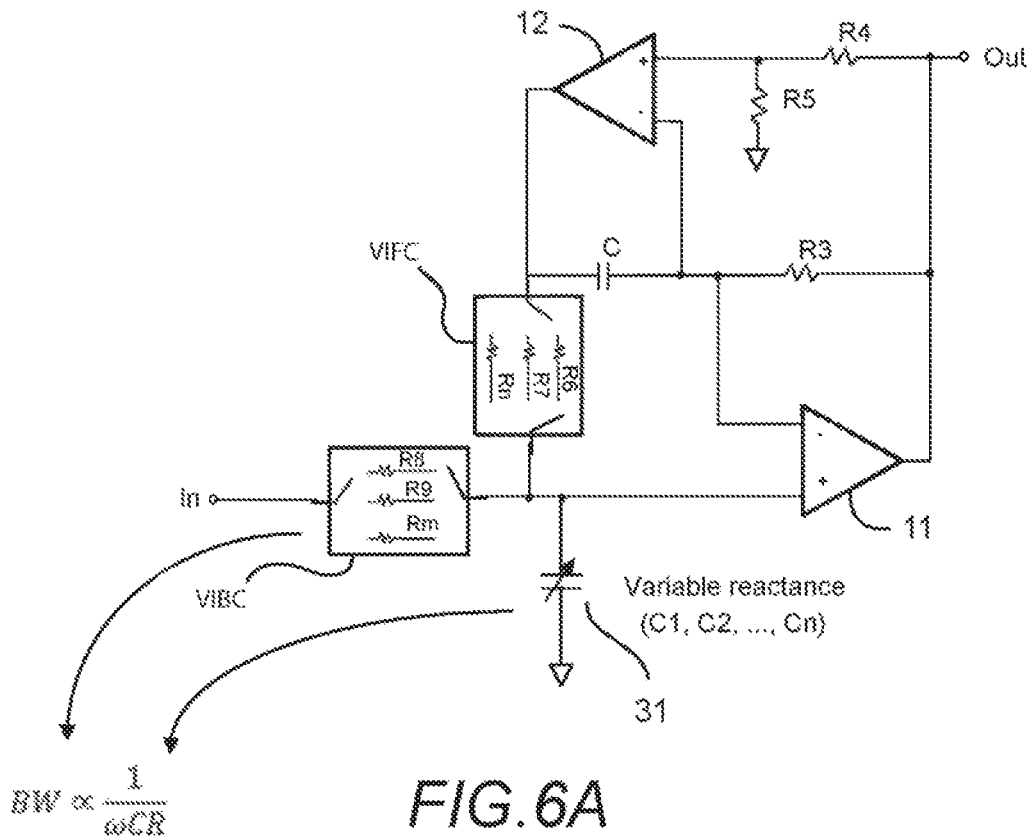
FIGS. 6(A-B) illustrate an example of a tunable filter circuit in accordance with another embodiment.
Figure 6B:
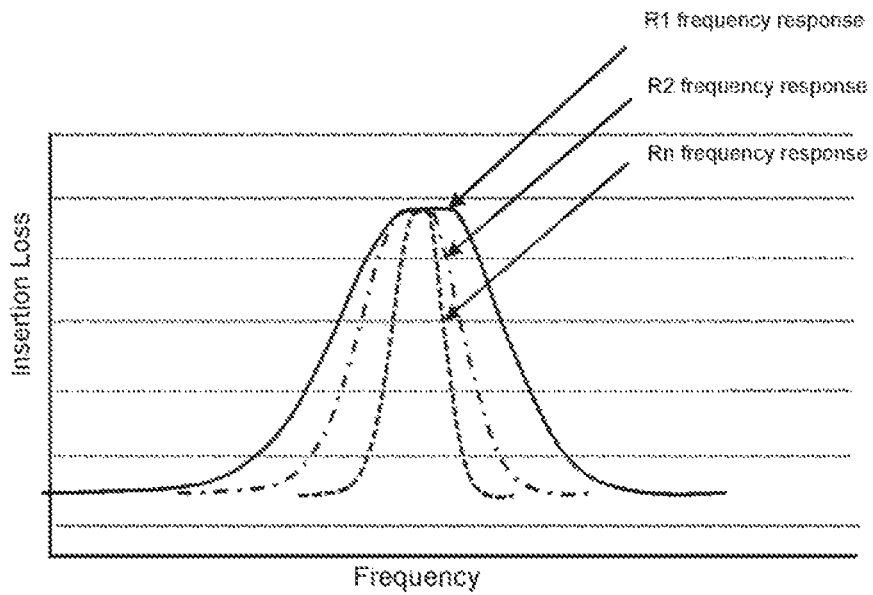

FIG. 6A illustrates an example of a tunable filter circuit where a variable capacitor 31 is coupled to the non-inverting input of first operational amplifier 11 for providing a variable reactance (C1, C2, . . . , Cn). A variable impedance frequency control (VIFC) network is also coupled to the non-inverting input of first operational amplifier 11. A second variable impedance network, variable impedance bandwidth control (VIBC) network, is coupled to the input port of the filter circuit. The resistance of the second variable impedance network (VIBC) can be adjusted to vary the bandwidth of the filter. The tunable filter circuit further includes a second operation amplifier 12, resistors (R3; R4; and R5), static capacitor (C), input port (In) and output port (Out) as shown. The frequency response of the tunable filter for three tuning states, $R_1$, $R_2$, and $R_n$ are shown in FIG. 6B.

Figure 7:
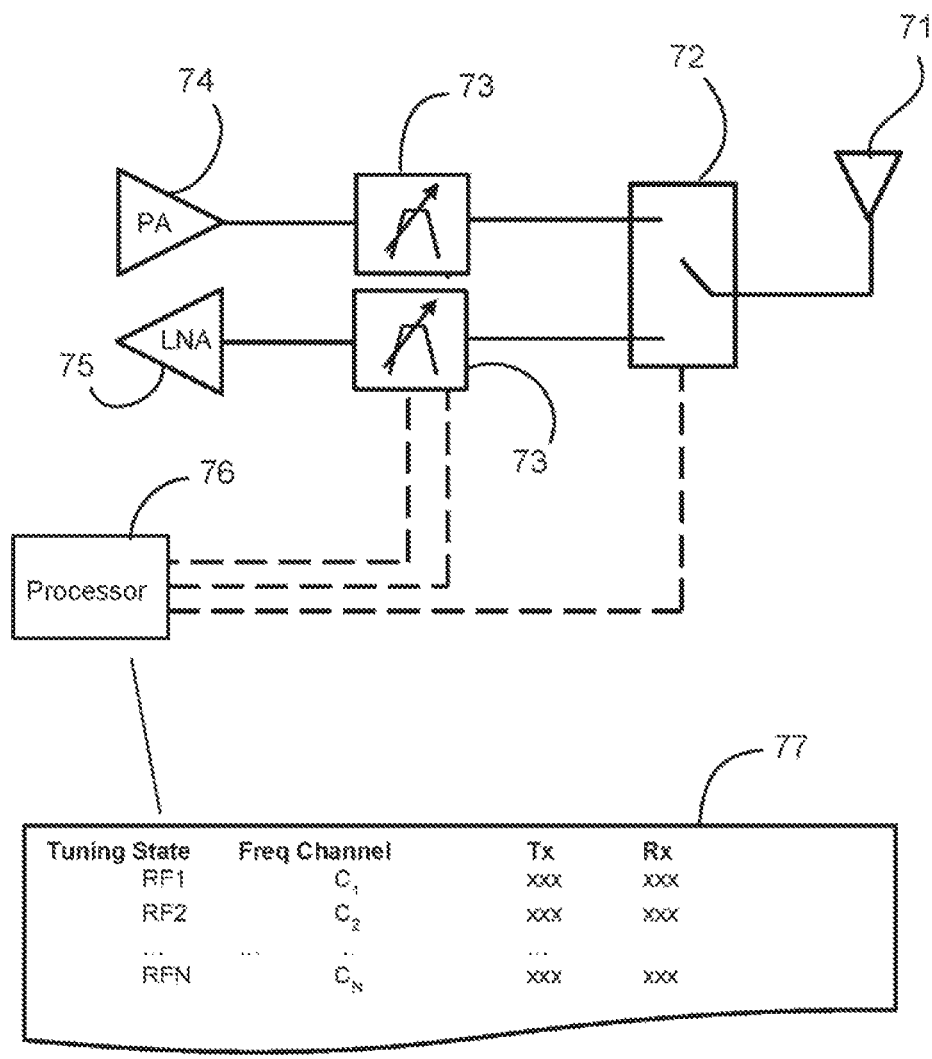
FIG. 7 illustrates a pair of tunable filters configured in an RF system for use in filter signals in the transmit and receive paths.

FIG. 7 illustrates a pair of tunable filters 73 configured in an RF system for use in filtering signals in the transmit and receive paths. One tunable filter is connected to the output of a power amplifier 74 and a port on a switch 72. The second tunable filter is connected to the input port of a low noise amplifier 75 and a port on the switch 72. A look-up table 77 is resident in a processor 76 and contains tuning state information to tune the filters for transmit and receive applications as a function of frequency channels.

Figure 8:
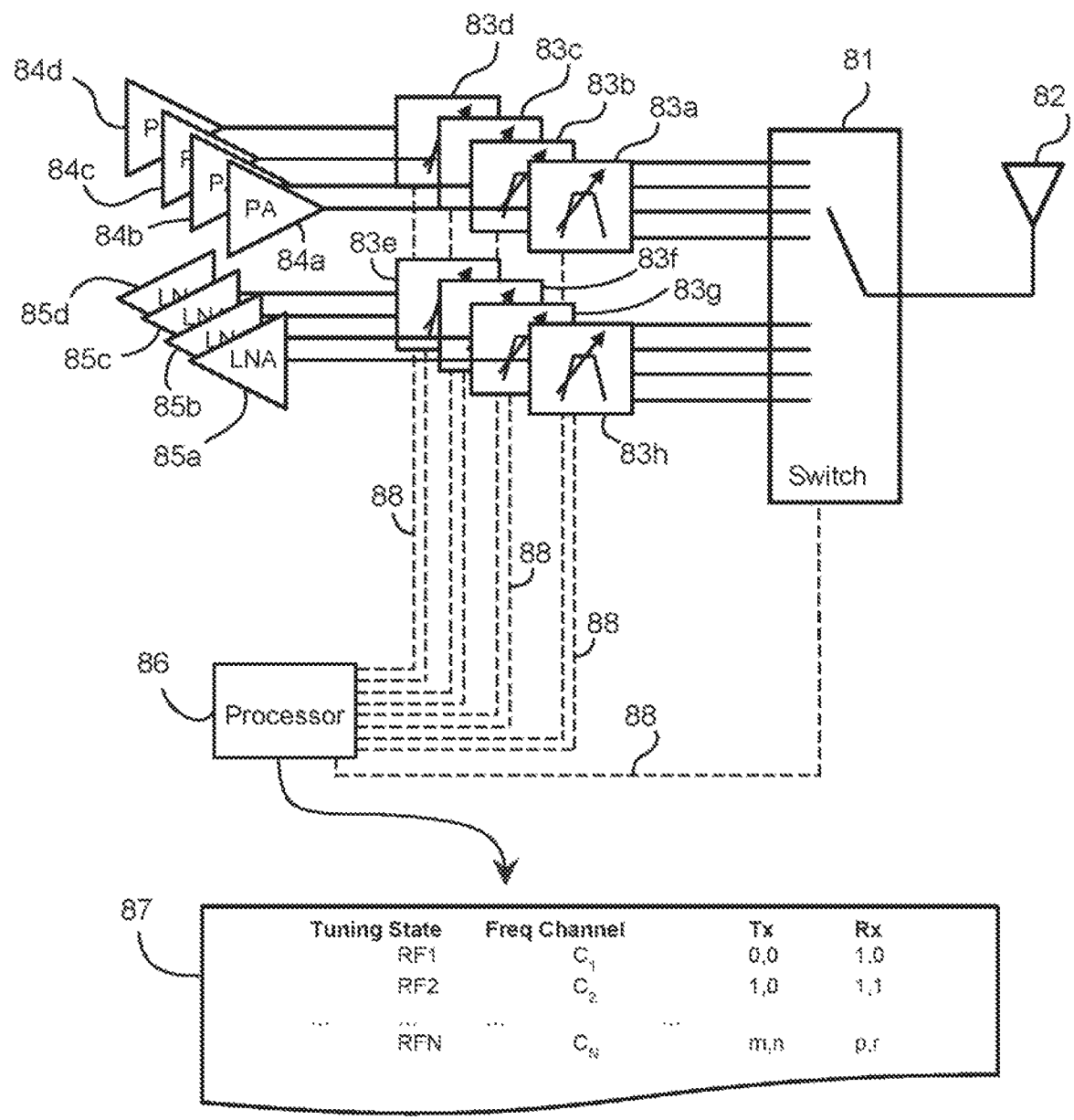
FIG. 8 illustrates a total of eight tunable filters configured with four tunable filters connected to four power amplifiers and four tunable filters connected to four low noise amplifiers.

FIG. 8 illustrates a total of eight tunable filters configured with four tunable filters 83(a-d) connected to four power amplifiers 84(a-d) and four tunable filters 83(e-h) connected to four low noise amplifiers 85(a-d). One port of each filter is connected to a single eight throw switch 81 which is in turn connected to a single antenna 82. A look-up table 87 is resident in a processor 86 and contains tuning state information to tune the filters for transmit and receive applications as a function of frequency channels.

Figure 9:
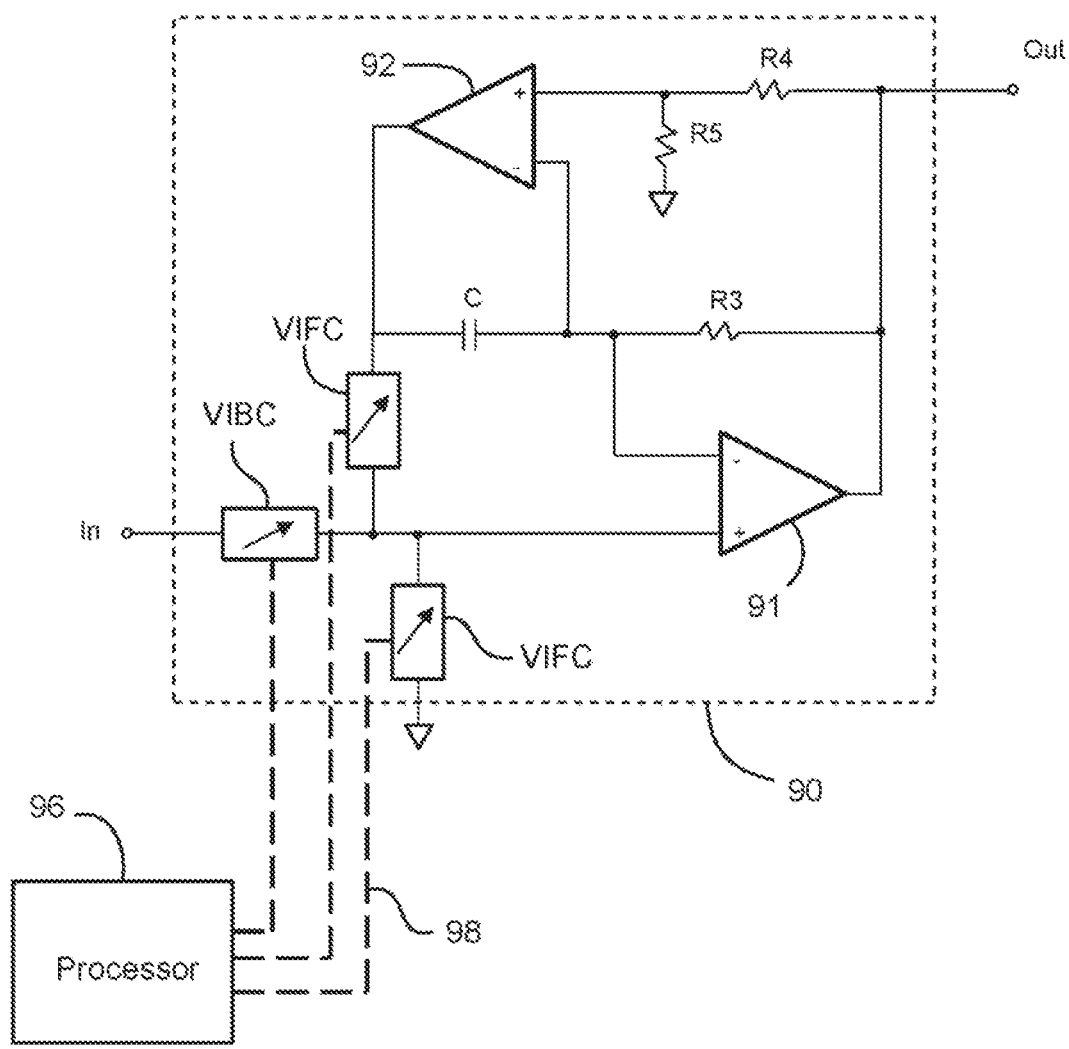
FIG. 9 illustrates a filter module.

FIG. 9 illustrates a tunable filter module 90. The pair of op amps 91;92 are shown along with three tunable components or circuits (VIBC; first VIFC and second VIFC as shown). Two tunable components or circuits (first and second VIFCs) are used for frequency control while a third tunable component or circuit (VIBC) is used for adjusting the bandwidth of the filter response. A processor 96 is shown along with control lines 98 to send control signals from the processor to the tunable components or circuits.

Figure 10A:
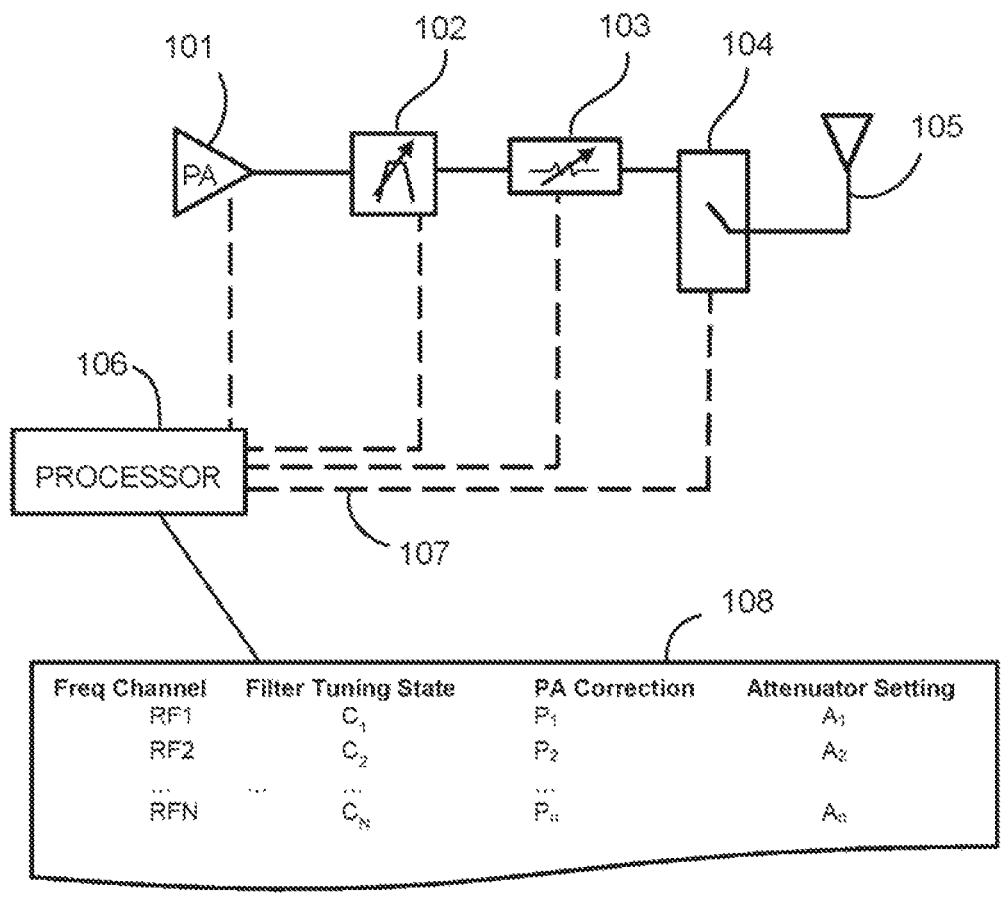
FIGS. 10(A-B) illustrate a method of implementing a look-up table in memory in a processor to control a PA, tunable filter, tunable attenuator, and switch.
Figure 10B:
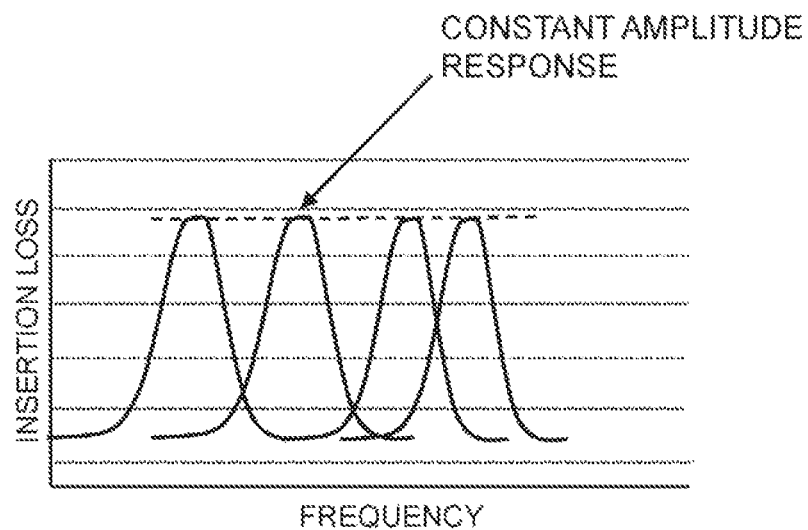

FIG. 10A illustrates a method of implementing a look-up table in memory in a processor to control a PA, tunable filter, tunable attenuator, and switch. The look-up table is populated with parameters that will provide for uniform output power from the PA/tunable filter combination as the tunable filter is adjusted for frequency. Here, antenna 105 is coupled to switch 104, tunable attenuator 103, tunable filter 102, and power amplifier 101 in that order as shown. Processor 106 is coupled to each of the switch, tunable attenuator, tunable filter, and power amplifier via control lines 107 extending therebetween. The look-up table 108 is loaded in the processor and configured to tune filter response and adjust output. FIG. 10B shows insertion loss as a function of frequency in accordance with the embodiment of FIG. 10A, including a constant amplitude response as shown.

Figure 11A:
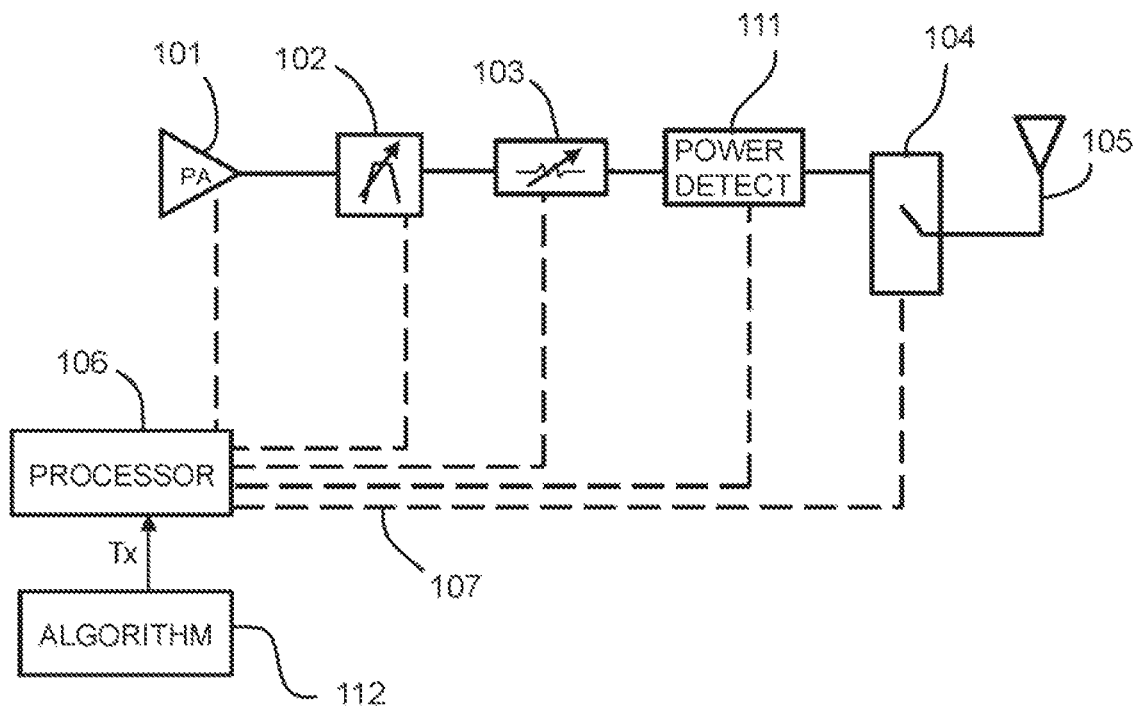
FIGS. 11(A-B) illustrate a method of implementing an algorithm in memory in a processor to control a PA, tunable filter, tunable attenuator, power detector and switch.
Figure 11B:
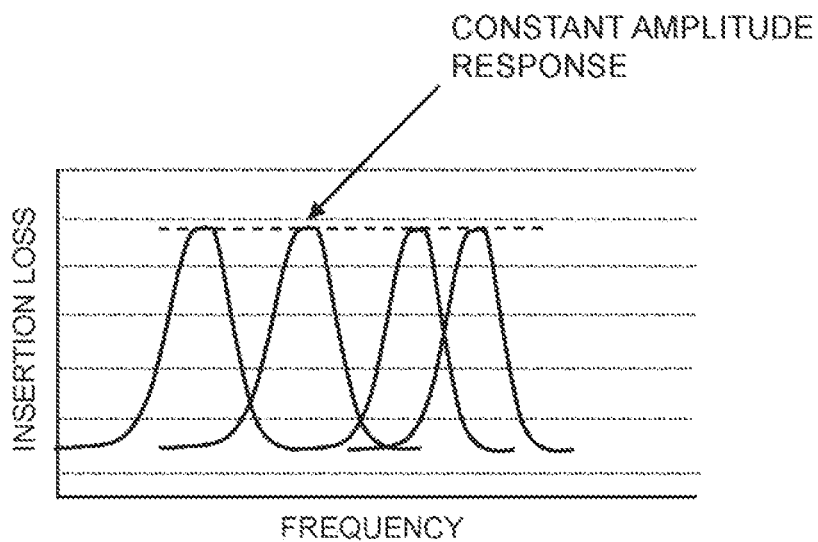

FIG. 11A illustrates a method of implementing an algorithm 112 in memory in a processor 106 to control a PA 101, tunable filter 102, tunable attenuator 103, power detector 111 and switch 104. The algorithm sends control signals to the components via control lines 107 to provide for uniform output power from the PA/tunable filter combination as the tunable filter is adjusted for frequency. Antenna 105 is coupled as shown. Here, the algorithm is loaded in the processor and configured to tune the filter response and adjust output power. FIG. 11B shows insertion loss as a function of frequency in accordance with that illustrated in FIG. 11A, including a constant amplitude response.

Figure 12A:
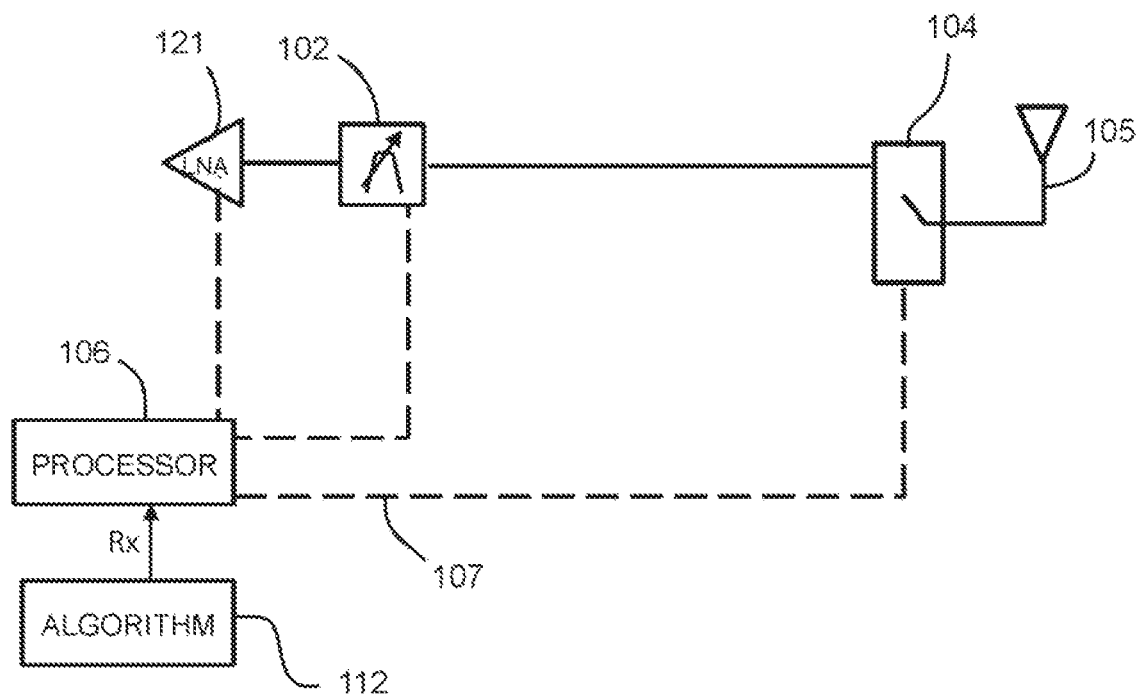
FIGS. 12(A-B) illustrate a method of implementing an algorithm in memory in a processor to control an LNA and tunable filter.
Figure 12B:
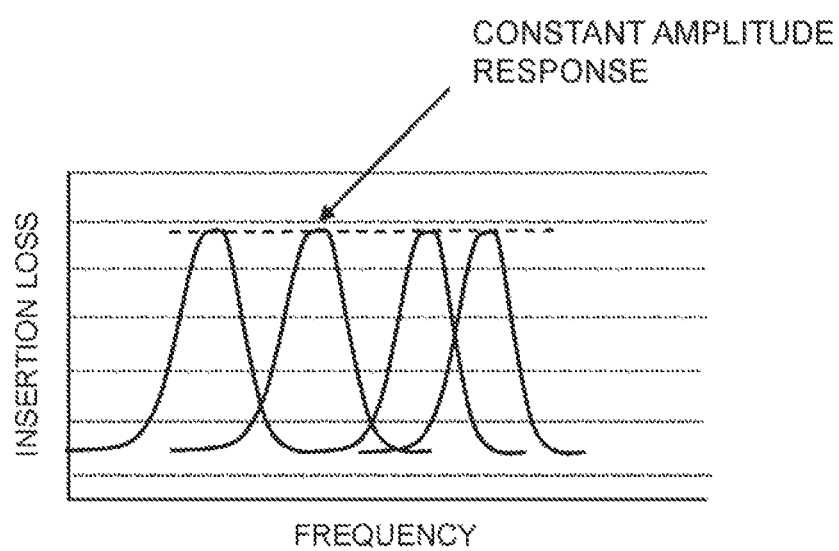

FIG. 12A illustrates a method of implementing an algorithm 112 in memory in a processor 106 to control an LNA 121 and tunable filter 102. The algorithm sends control signals via control lines 107 to the components 121; 102; 104 to provide for uniform receive power from the LNA/tunable filter combination as the tunable filter is adjusted for frequency. Antenna 105 is coupled to the circuit as shown. FIG. 12B shows insertion loss as a function of frequency in accordance with that illustrated in FIG. 12A, including a constant amplitude response.

Figure 13B:
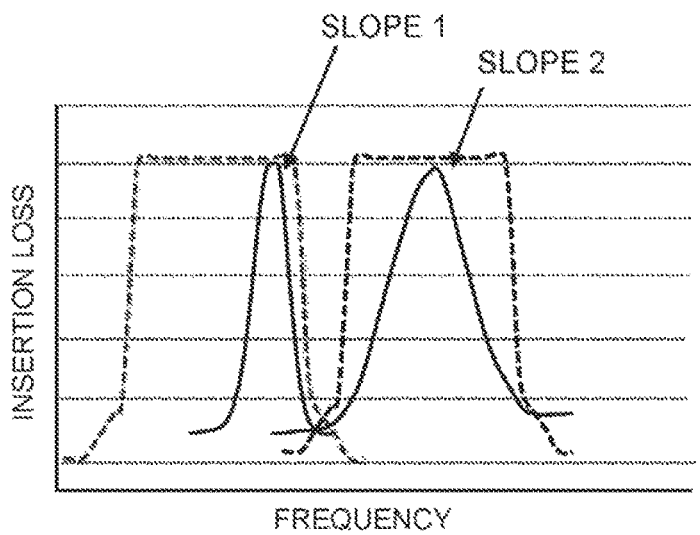
FIGS. 13(A-B) illustrate the front-end of a communication system where tunable filters are implemented in both the transmit and receive chains.
Figure 13A:
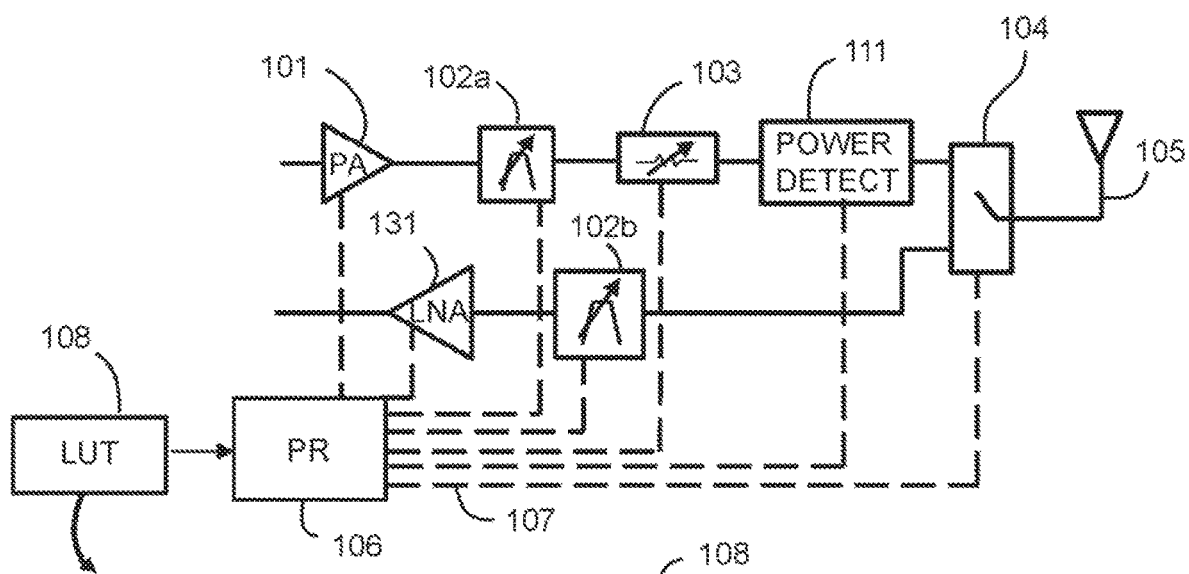

FIG. 13A illustrates the front-end of a communication system where tunable filters 102a; 102b are implemented in both the transmit and receive chains. A look-up table 108 is implemented in memory resident in a processor 106, with the look-up table containing parameters used to control the Tx and Rx tunable filters along with the PA 101 and LNA 131 and tunable attenuator 103 as a function of frequency channel information. Also shown is power detector 111, switch 104, and antenna 105, which are arranged in similar fashion as other embodiments disclosed herein. FIG. 13B shows insertion loss as a function of frequency in accordance with that illustrated in FIG. 13A, including filter slope adjustment as a function of frequency channels, including steeper slope (SLOPE 1), and relaxed slope (SLOPE 2).

Figure 14B:
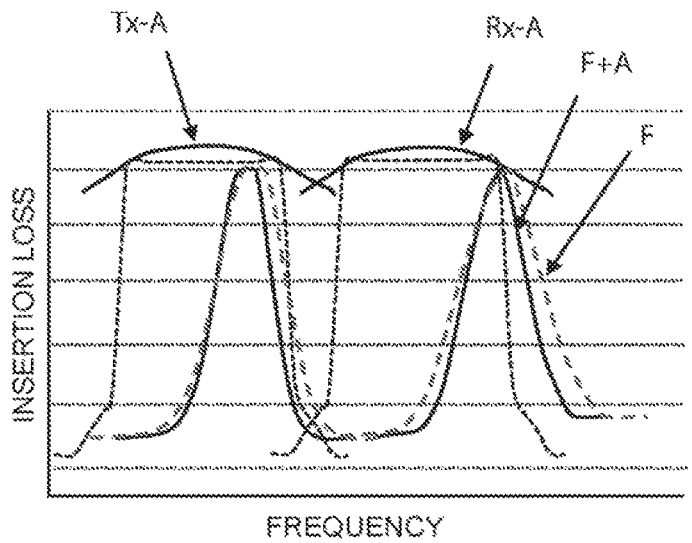
FIGS. 14(A-B) illustrate the front-end of a communication system where tunable filters are implemented in both the transmit and receive chains.
Figure 14A:
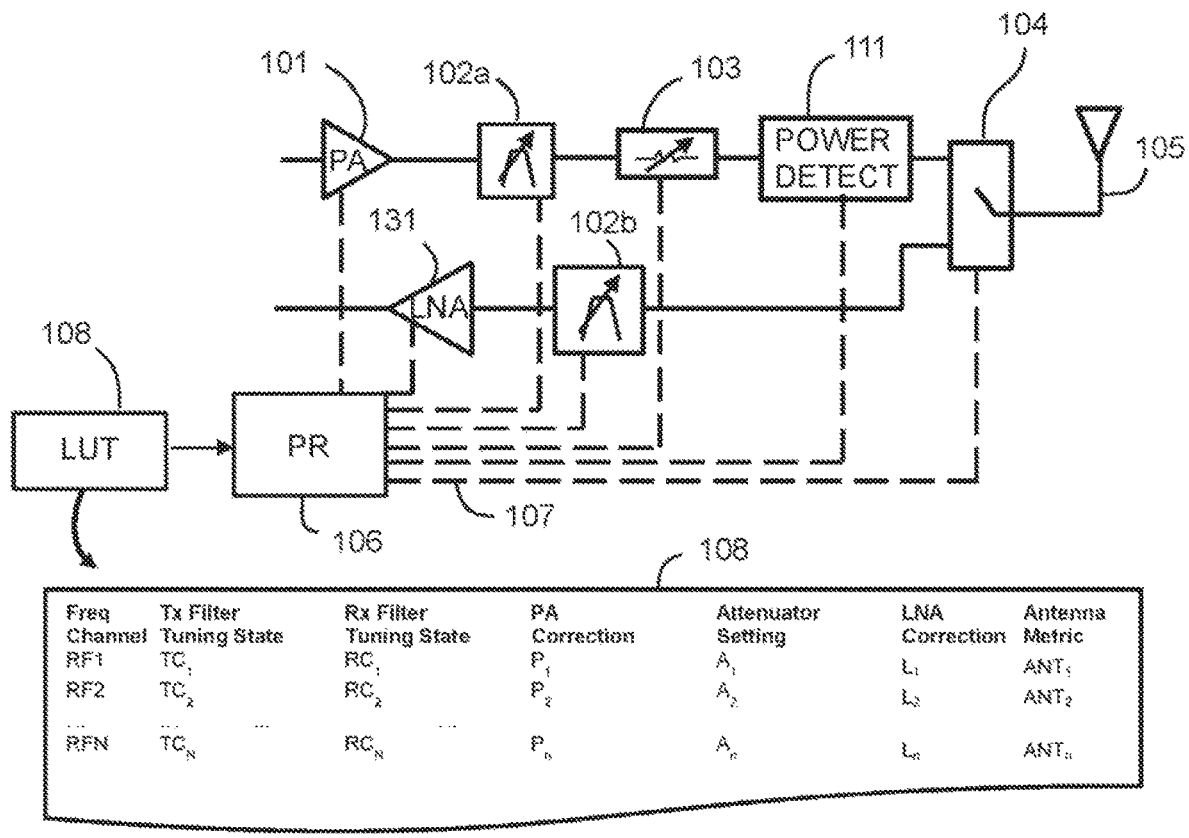

FIG. 14A illustrates the front-end of a communication system where tunable filters 102a; 102b are implemented in both the transmit and receive chains. A look-up table 108 is implemented in memory resident in a processor 106, with the look-up table containing parameters used to control the Tx and Rx tunable filters along with the PA 101 and LNA 131 and tunable attenuator 103 as a function of frequency channel information. In this configuration, the filter response in both the transmit and receive chains are compensated based upon the antenna frequency response. Also shown is power detector 111, switch 104, and antenna 105, which are arranged in similar fashion as other embodiments disclosed herein. FIG. 14B shows insertion loss as a function of frequency in accordance with that illustrated in FIG. 14A, including filter slope adjustment as a function of frequency channel compensated for antenna frequency response, including transmit antenna response (Tx-A), receive antenna response (Rx-A), filter plus antenna response (F+A), and filter response (F) as shown.

Figure 15:
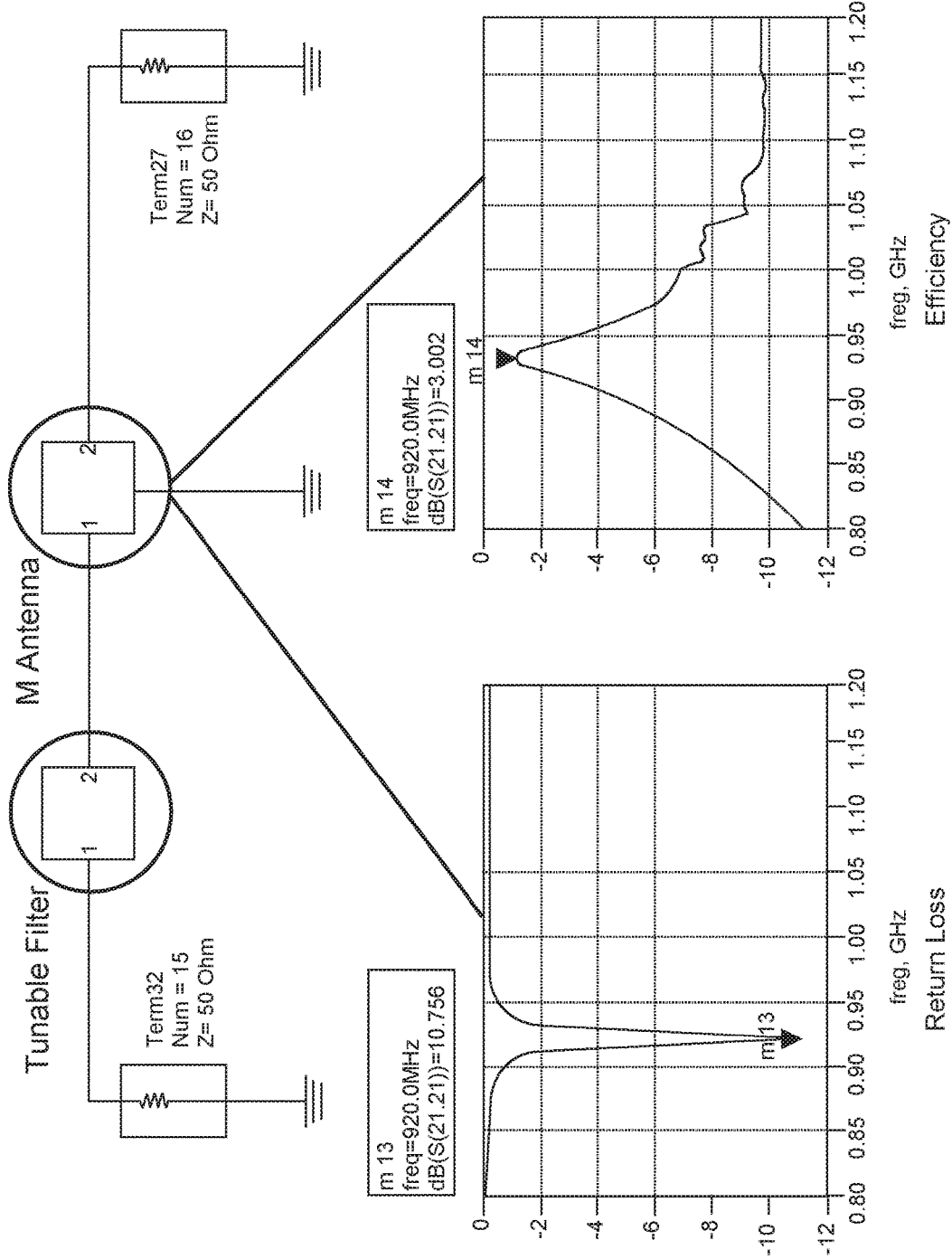
FIG. 15 illustrates a tunable filter and antenna circuit simulation.

FIG. 15 illustrates a tunable filter and antenna circuit simulation. The return loss and efficiency of the antenna. The antenna is an IMD (Isolated Magnetic Dipole) "M" type element which exhibits a narrow band frequency response.

Figure 16:
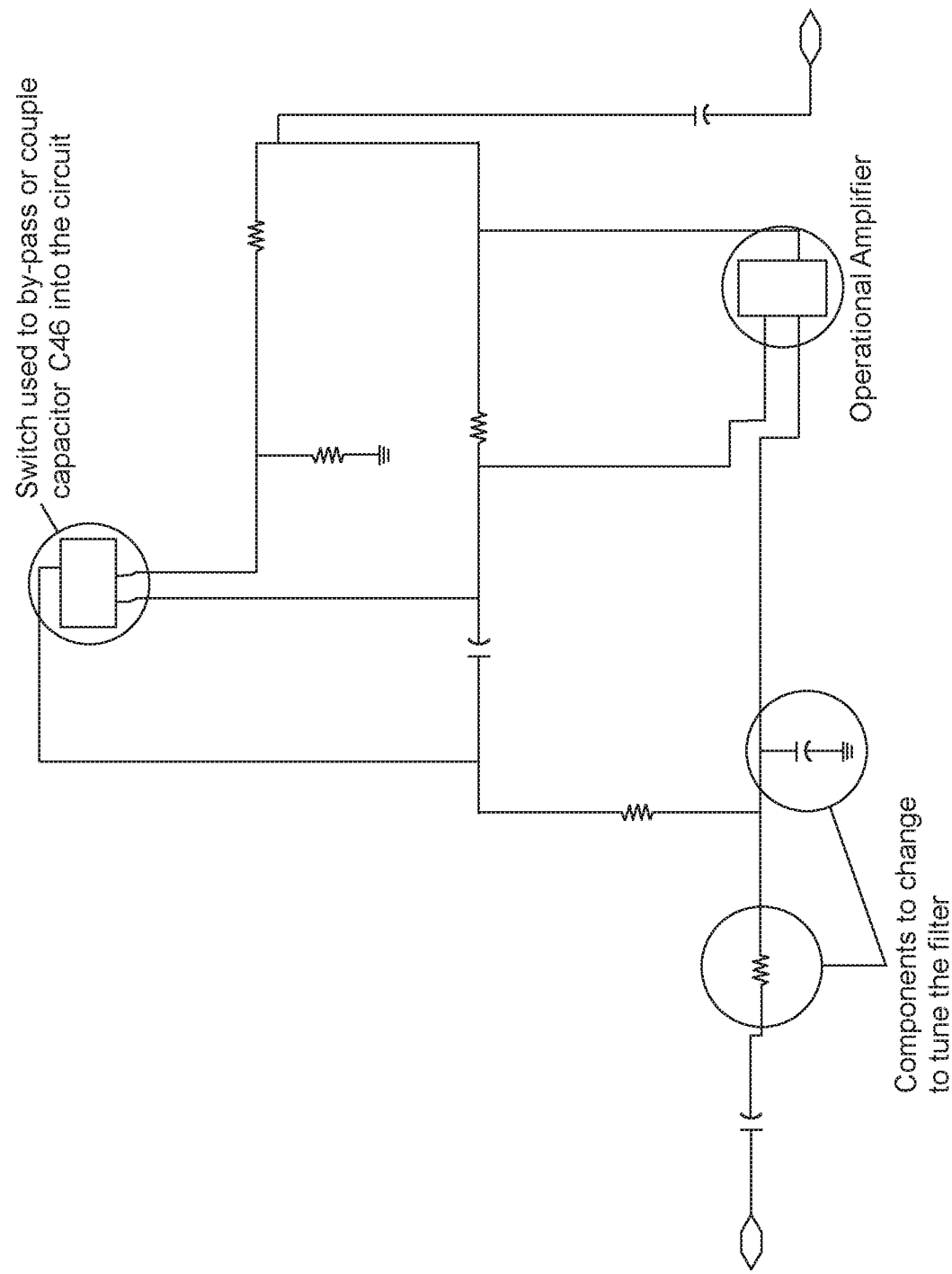
FIG. 16 illustrates a tunable filter topology, showing an operational amplifier and components to provide the tuning function.

FIG. 16 illustrates a tunable filter topology, showing an operational amplifier and components to provide the tuning function. A switch is shown which provides the capability of utilizing or by-passing a capacitor. Resistor R78 and capacitor C47 are shown, and these two components are used to adjust the frequency response of the filter.

Figure 17:
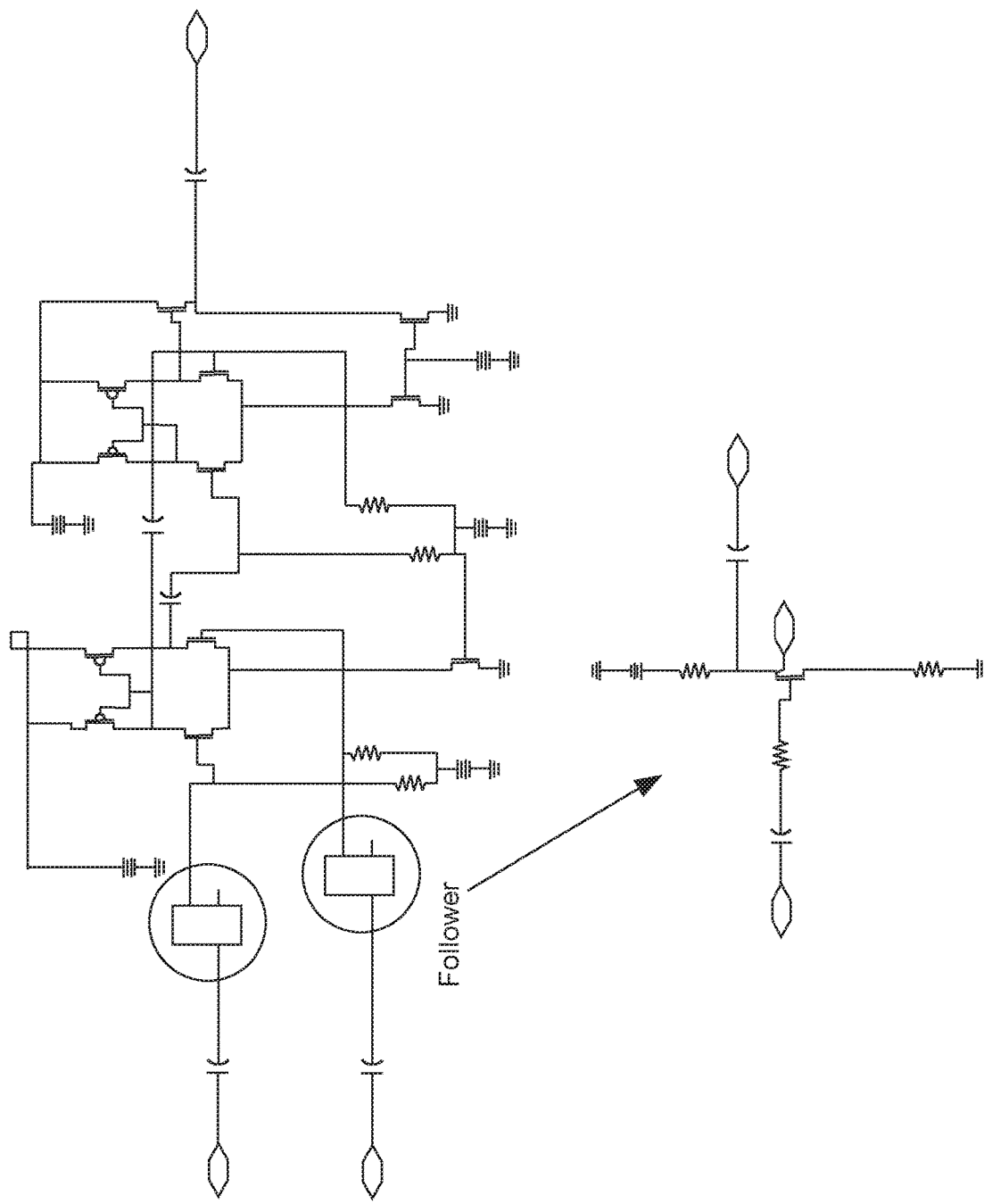
FIG. 17 illustrates a detailed circuit topology of the operational amplifier.

FIG. 17 illustrates a detailed circuit topology of the operational amplifier. Two follower circuits are highlighted and the circuit topology of the follower circuit is shown.

Figure 18:
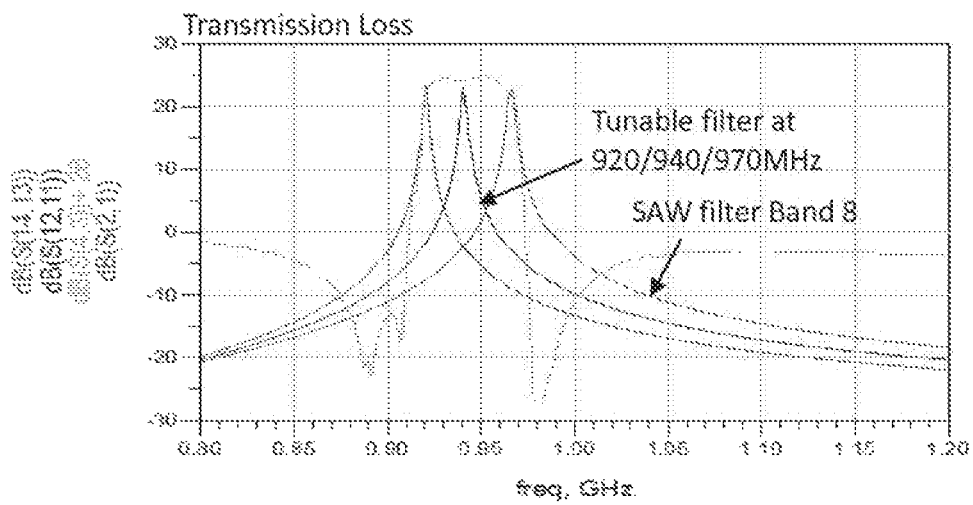
FIG. 18 illustrates the transmission loss characteristics of the tunable filter and antenna circuit shown in FIG. 15.
Figure 18:
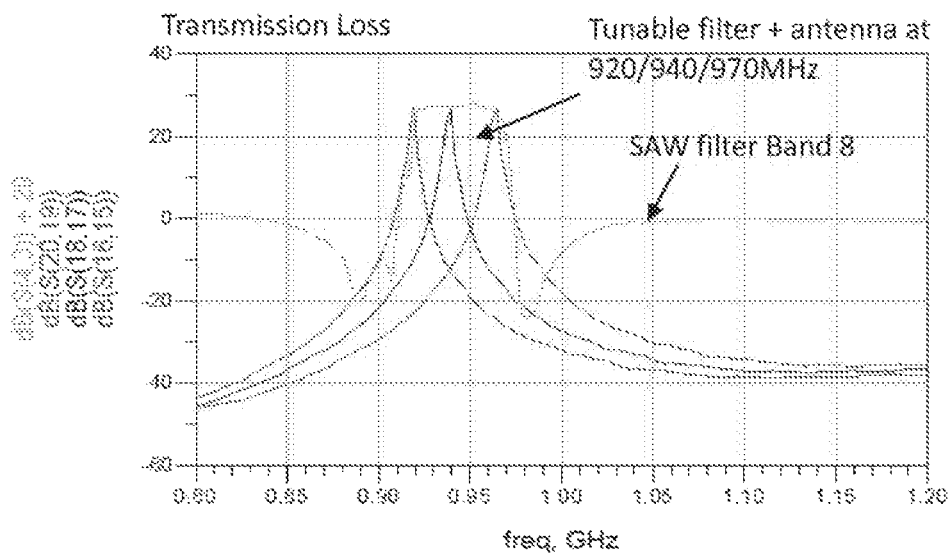

FIG. 18 illustrates the transmission loss characteristics of the tunable filter and antenna circuit shown in FIG. 15. Three frequency tuning states are shown for the tunable filter without the antenna response included, and are compared to a SAW filter optimized for Band 8 (925 to 960 MHz). A second plot containing transmission loss characteristics of the tunable filter and antenna response is also shown, and are compared to a SAW filter optimized for Band 8 (925 to 960 MHz). The roll-off in transmission loss of the tunable filter and antenna combination is greater when compared to the tunable filter only, and provides a better match to the transmission loss characteristics of the SAW filter.

What is claimed is:

1. A communication system, comprising:
    at least one tunable filter circuit capable of dynamic adjustment of a frequency, bandwidth, or transmission loss characteristics;
    a processor;
    a lookup table (LUT) resident in the processor or other memory cell;
    wherein the at least one tunable filter circuit comprises:
        a first operational amplifier comprising a non-inverting input and an output thereof;
        a second operational amplifier comprising a non-inverting input and an output thereof,
        the output of the first operational amplifier connected to the non-inverting input of the second operational amplifier at an output of the at least one tunable filter circuit;
        the output of the second operational amplifier connected to the non-inverting input of the first operational amplifier at an input of the at least one tunable filter circuit;
    wherein the at least one tunable filter circuit further comprises:
        a variable capacitor connected in shunt between the non-inverting input of the first operational amplifier and ground;
        wherein the variable capacitor is configured to receive control signals for changing a tuning state of the variable capacitor; and
        wherein the at least one tunable filter circuit is tuned by changing the tuning state of the variable capacitor.

2. The communication system of claim 1, further comprising an antenna.

3. The communication system of claim 2, wherein the antenna comprises an isolated magnetic dipole antenna.

4. The communication system of claim 2, wherein the processor is configured to adjust a bandwidth of the at least one tunable filter circuit such that the at least one tunable filter circuit and the antenna provide a frequency response characteristic for the communication system.

5. The communication system of claim 1, wherein the at least one tunable filter circuit comprises a first tunable filter circuit in a transmit path and a second tunable filter circuit in a receive path.

6. The communication system of claim 1, wherein a first tunable filter circuit is coupled to an output of a power amplifier.

7. The communication system of claim 1, wherein a second tunable filter circuit is coupled to an input of a low noise amplifier.

8. The communication system of claim 1, wherein a center frequency of the at least one tunable filter circuit is adjusted by changing the tuning state of the variable capacitor.

9. The communication system of claim 1, wherein the at least one tunable filter circuit further comprises: a first variable impedance network connected between the output of the second operational amplifier and the non-inverting input of the first operational amplifier, the first variable impedance network comprising a switch coupled to a plurality of resistors, wherein each of the plurality of resistors comprises a distinct impedance relative to another.

10. The communication of claim 9, wherein the first variable impedance network is configured to adjust a center frequency of the at least one tunable filter circuit.

* * * * *